United States Patent [19]
Estes et al.

[11] Patent Number: 5,451,720
[45] Date of Patent: Sep. 19, 1995

[54] CIRCUIT BOARD THERMAL RELIEF PATTERN HAVING IMPROVED ELECTRICAL AND EMI CHARACTERISTICS

[75] Inventors: H. Scott Estes; David Staggs; Deepak Swamy, all of Austin, Tex.

[73] Assignee: Dell USA, L.P., Austin, Tex.

[21] Appl. No.: 216,747

[22] Filed: Mar. 23, 1994

[51] Int. Cl.⁶ ............................................. H05K 1/00
[52] U.S. Cl. .................... 174/250; 174/252; 174/257; 174/262; 174/263; 174/266
[58] Field of Search ............... 174/250, 252, 256, 257, 174/262, 263, 266; 361/792, 794

[56] References Cited

U.S. PATENT DOCUMENTS 5,264,664 11/1993 McAllista et al. .
5,326,937 7/1954 Watanabe .

Primary Examiner—Leo P. Picard
Assistant Examiner—Cheryl R. Figlin
Attorney, Agent, or Firm—David Hitt; James Huffman

[57] ABSTRACT

A circuit board having a thermal relief pattern for isolating heat generated during soldering of components thereon. The circuit board comprises (1) a substantially planar insulating substrate, the substrate having a via therethrough and (2) a substantially planar conductive layer located over the substrate, the via passing through the layer, the layer having a thermal relief pattern comprising a plurality of apertures located about the via, the plurality of apertures cooperating to restrict heat flow across the thermal relief pattern, each of the plurality of apertures having a boundary with the conductive layer free of discontinuities to inhibit edge effect electromagnetic resonance, the plurality of apertures defining a plurality of corresponding conductive bands in the conductive layer and between the plurality of apertures, the conductive bands cooperating to provide a predetermined minimum level of electrical conduction across the thermal relief pattern.

20 Claims, 3 Drawing Sheets

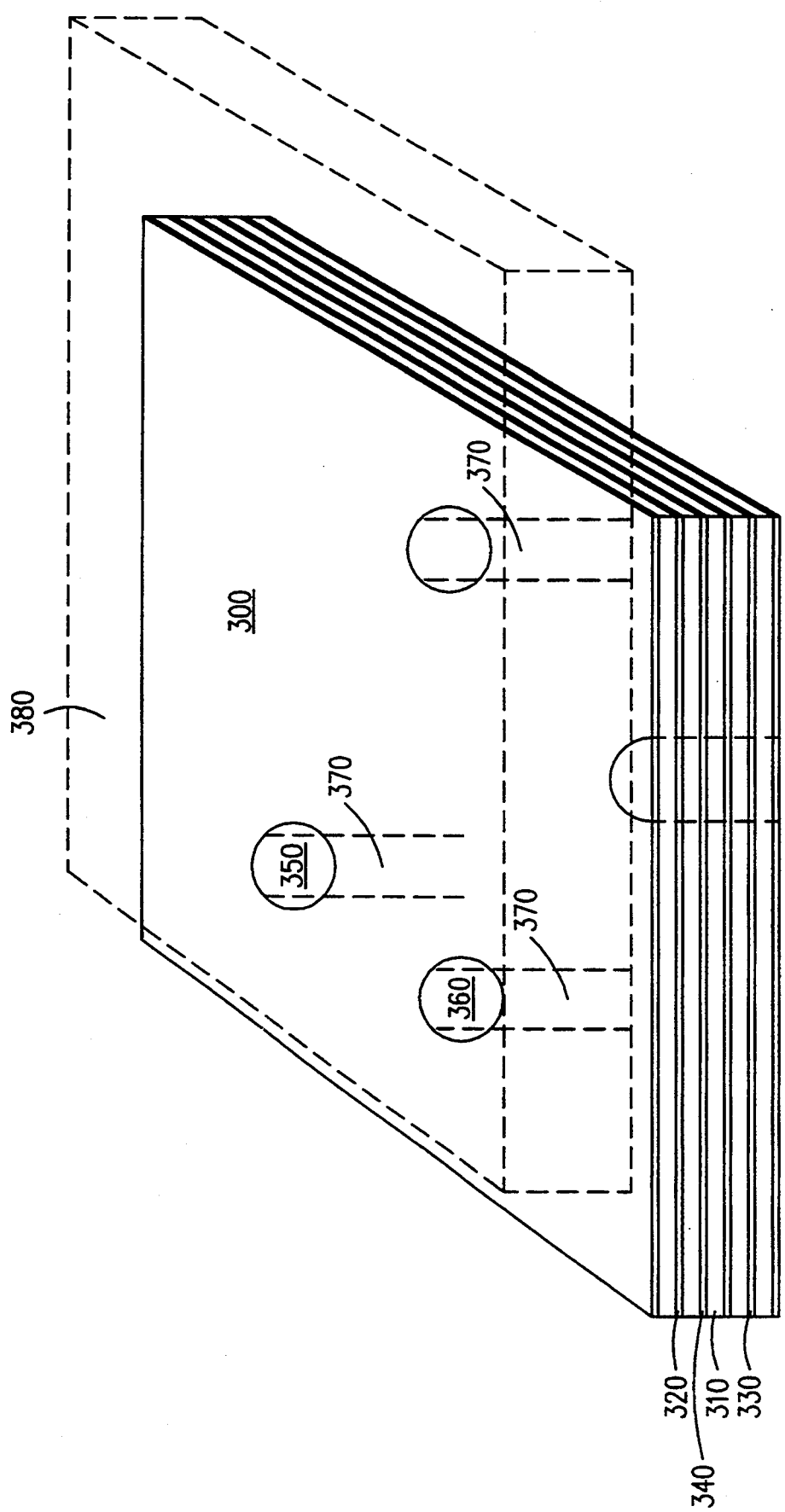

CIRCUIT BOARD THERMAL RELIEF PATTERN HAVING IMPROVED ELECTRICAL AND EMI CHARACTERISTICS

TECHNICAL FIELD OF THE INVENTION

The present invention is directed, in general, to circuit boards and, more specifically, to such boards employing a novel thermal relief pattern in conductor planes thereon that ensures creation of a strong solder joint, the pattern having improved electrical and electromagnetic interference ("EMI") characteristics.

BACKGROUND OF THE INVENTION

For many years, it has been customary to employ printed circuit boards ("PCBs") or printed circuit assemblies ("PCAs") as a medium for mechanically holding electronic components together and for providing electrical interconnections among the components. The earliest PCBs were constructed of an insulating planar substrate (such as a glass fiber/resin combination) upon which was deposited a layer of conductive metal. Most typically, the metal layer coated the entire surface of the substrate and was chemically etched to place a pattern of conductors (or "traces") on the surface. Often, metal layers were provided on both the upper and lower surfaces of the substrate to allow conductors to cross one another without making electrical contact. A plurality of mounting holes or "vias" were drilled through the metal layer and substrate. The vias were situated to receive leads from the electronic components.

To complete assembly of a circuit board, the electronic components were placed on the PCB, either by hand or robotic machine, the leads of the components passing through corresponding vias. Lastly, solder connections were made to ensure reliable electrical contact between the components and the traces. Initially, soldering was performed manually. Subsequently, more efficient machine-soldering techniques employing infrared ovens or solder baths were developed to speed manufacture of circuit boards and to ensure higher solder joint reliability.

Under such machine-soldering techniques, the PCB and its components were heated. Solder, under the influence of flux, was caused to contact the board and flowed by capillary action into the vias, yielding a low resistance solder joint when cooled.

As circuit board technology developed, designers began to create circuit boards comprising many alternating substrate and conductive layer pairs, resulting in sandwiched circuit boards that could accommodate a higher component density. Such boards could accommodate ten or more conductive layers.

Designers also recognized that, given the number of layers available, it became advantageous to dedicate one layer to provide power to the components and another layer to serve as an electrical ground for the components. Since most of the components require direct access to either power or a ground, these dedicated layers often extended the full area of the PCB. For this reason, the dedicated power layer was termed a "power plane" and the dedicated ground layer was termed a "ground plane." Vias passed through the power and ground planes, allowing component leads to be soldered thereto as required.

Unfortunately, these designers discovered that the power and ground planes acted as efficient heat sinks during the soldering process, causing the planes to cool much faster than the remainder of the PCB. The planes cooled proximate the vias, such that, when solder was introduced, the temperature of the plane was insufficient to allow the solder to flow freely to create a good joint. Instead, the solder tended to solidify unevenly where the via met the planes, causing a "cold joint" of relatively high resistance and poor mechanical strength.

In response, designers provided a prior art thermal relief pattern about each via adapted to provide a degree of thermal isolation between the plane proximate a given via (within the pattern) and the rest of the plane (without the pattern). The prior art thermal relief pattern consisted of a number of cutouts in the conductive layer surrounding a given via. The cutouts had sharp corners or "discontinuities." In between the cutouts remained relatively narrow intersticial bands of conductive metal. The specific geometry of the prior art thermal relief pattern will be described in connection with, and illustrated in, FIG. 1, to follow.

While the prior art thermal relief pattern was suitable to isolate the plane proximate the via thermally from the surrounding plane, designers realized that the interstitial conductive bands posed a significant limit on the amount of current that could be conducted between the via and the rest of the plane. This current-handling limitation became more frustrating as components grew in their power requirements.

Further, as the electronic components began to operate at higher frequencies (particularly in computer systems, including today's personal computers ("PCs")), the designers found that the discontinuities created edge effects, causing reflection of high frequency currents away from the bands instead of allowing the currents to flow through the bands or, worse yet, constructively superposing frequencies, thereby generating or amplifying still higher frequencies and creating or exacerbating an EMI problem. Further, repeated reflections caused resonances of high frequencies between ones of the discontinuities, creating and amplifying harmonics as a function of the distances between the discontinuities. As operating frequencies of the components rose over time, EMI production and retention grew even more problematical.

Accordingly, what is needed in the art is a thermal relief pattern that is at least as adept at thermally isolating the plane proximate each via from the remainder of the plane, but also a pattern that has improved current-handling and EMI characteristics.

SUMMARY OF THE INVENTION

To address the above-discussed deficiencies of the prior art, it is a primary object of the present invention to provide a circuit board having a thermal relief pattern for isolating heat generated during soldering of components thereon that has a greater current-handling capacity and reduced electromagnetic emissions.

In the attainment of the above-described primary object, the present invention provides a circuit board comprising (1) a substantially planar insulating substrate, the substrate having a via therethrough and (2) a substantially planar conductive layer located over the substrate, the via passing through the layer, the layer having a thermal relief pattern comprising a plurality of apertures located about the via, the plurality of apertures cooperating to restrict heat flow across the thermal relief pattern, each of the plurality of apertures having a boundary with the conductive layer free of discontinuities to inhibit edge effect electromagnetic resonance, the plurality of apertures defining a plurality of corresponding conductive bands in the conductive layer and between the plurality of apertures, the conductive bands cooperating to provide a predetermined minimum level of electrical conduction across the thermal relief pattern. The via is adapted to receive a lead of an electronic component and, subsequently, molten solder to create a solder joint mechanically fixing the lead within the via and electrically joining the lead with the conductive layer. The conductive layer either may or may not cover an inner surface of the via (or "plated through").

In a preferred embodiment, the plurality of apertures are located in a ring surrounding and substantially centered on the via. The plurality of apertures are preferably substantially ovoid and are more preferably substantially circular. Because the conductive layer is adapted to carry radio frequency alternating electric current (in addition to direct current or relatively low frequency current), the rounded boundary of the apertures is needed, thereby eliminating relatively sharp corners, points or relatively small-radius bends (so-called "discontinuities") in the boundary thereof that cause edge effects. As previously described, edge effects cause reflection, deflection and potential amplification of higher frequency electrical currents, causing EMI and hampering the performance of the circuit board.

In a preferred embodiment, there are at least five apertures. This increases the number of interstitial conductive bands, thereby increasing the current-handling capacity of the thermal relief pattern. This enables the thermal relief pattern to be used on both the power and ground planes, wherein power handling requirements are more rigid. The plurality of apertures may be etched in the conductive layer or formed by other conventional techniques.

The conductive layer may be composed of copper metal, although other conductive metals are within the scope of the present invention. The conductive layer may be located on an outer surface of the circuit board or may be an intermediate layer of a multi-layer circuit board. In such boards, a plurality of alternating substrate and conductive layers form a plurality of spaced-apart conductive patterns for communication of electrical signals.

The foregoing has outlined rather broadly the features and technical advantages of the present invention so that the detailed description of the invention that follows may be better understood. Additional features and advantages of the invention will be described hereinafter which form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 illustrates an isometric view of a multi-layer circuit board having ground and power planes employing the thermal relief pattern of the present invention.

DETAILED DESCRIPTION

Figure 1:
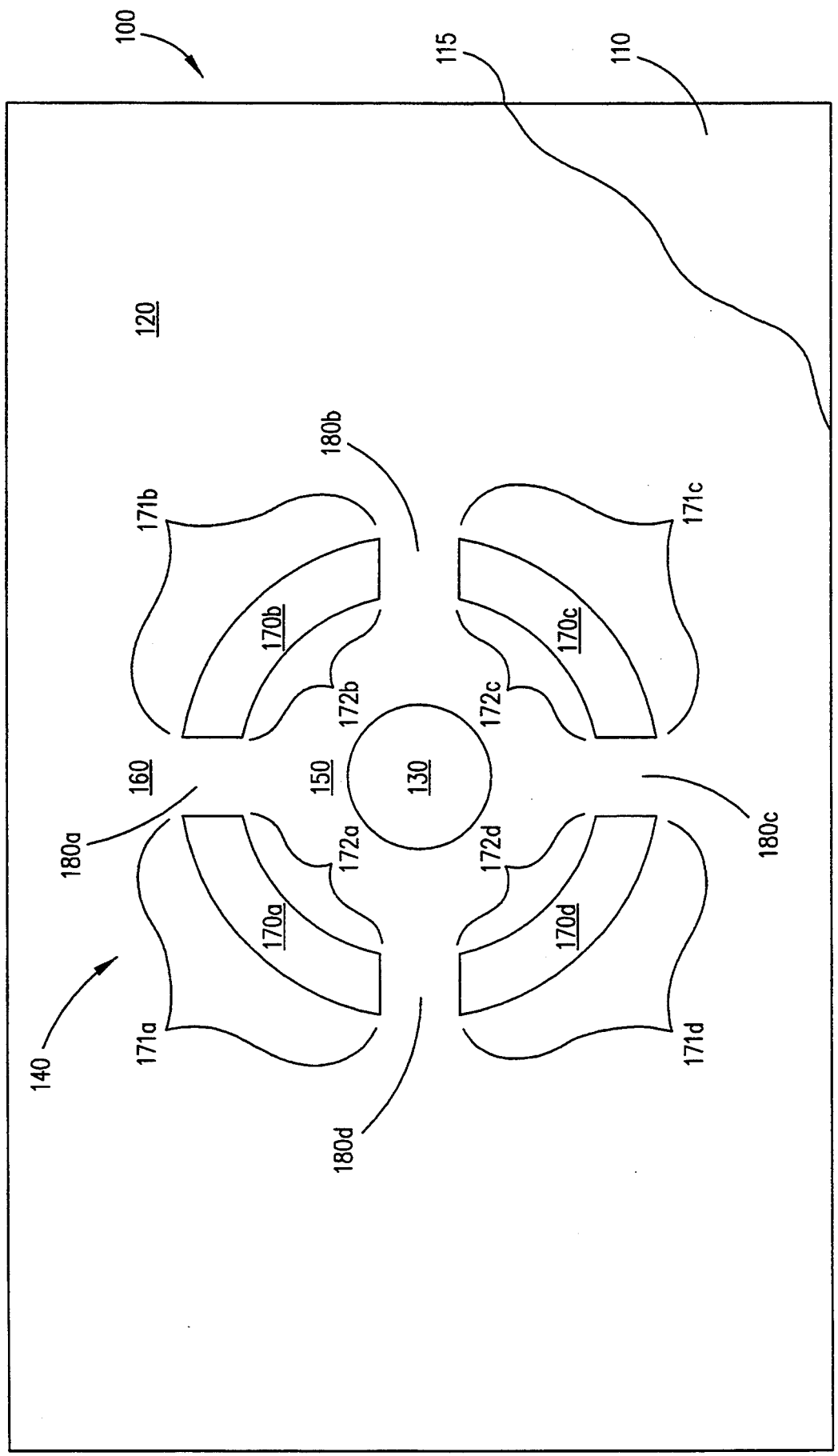
FIG. 1 illustrates a plan view of a circuit board employing a prior art thermal relief pattern.

Referring initially to FIG. 1, illustrated is a plan view of a circuit board, generally designated 100, employing a prior art thermal relief pattern. Shown are a substrate 110 having a conductive layer 120 located thereon. The substrate 110 is conventional in composition, for instance, a glass fiber and polymer resin combination typically referred to as fiberglass. The substrate 110 is substantially planar, having an upper surface 115 and a lower surface (not shown). For simplicity, FIG. 1 shows the conductive layer 120 deposited on only the upper surface 115 of the substrate 110, although those skilled in the art realize that many prior art circuit boards have conductive layers deposited on both the upper and lower surfaces to accommodate more traces.

The conductive layer 120 is shown as a planar coating (often composed of copper metal) deposited on the entirety of the upper surface 115 of the substrate 110, save for a small area that has been cut away to show the underlying substrate 110. Those skilled in the art are aware of coating deposition or removal techniques (such as etching) that allow selective deposition or removal of portions of the conductive layer 120 to produce a pattern of conductors or traces in the conductive layer 120. This pattern of traces serves to interconnect components mounted to the circuit board 100.

FIG. 1 further shows a via 130 that passes through both the substrate 110 and the conductive layer 120. The via 130 is adapted to receive a conductive lead of a component therethrough. On a typical circuit board 100, many such vias are arranged according to a desired component placement. Once a component lead has been inserted into the via 130, the circuit board 100, including the conductive layer 120, is heated and a sufficient quantity of molten solder (not shown) is placed proximate the via 130 and drawn therein, often under the influence of capillary action or surface tension and often with the aid of a conventional solder flux. The circuit board 100 is allowed to cool, thereby solidifying the solder to create a mechanically and electrically sound solder joint. Thus, the via 130 serves both to fix the component mechanically to the circuit board 100 and to couple the lead electrically to a portion of the conductive layer 120 of the circuit board 100 to allow communication of electrical signals therewith.

As previously described, when the conductive layer 120 is substantial in area (as opposed to being a narrow trace) and particularly when the conductive layer extends as a plane throughout the circuit board 110, the conductive layer acts as an efficient heat sink. Thus, when the circuit board 100 is heated to allow a solder joint to be formed at the via 130, the planar conductive layer 120 resists the heating and sheds the heat it gathers relatively quickly. Unfortunately, the planar conductive layer 120 tends also to take heat from the molten solder as it comes into contact with the conductive layer 120. This forces the solder to cool too rapidly, unevenly or both, causing a mechanically and electrically inferior solder joint (sometimes referred to as a "cold joint") where the solder meets the planar conductive layer 120.

Thus, the prior art provides a thermal relief pattern 140 to insulate a portion 150 of the conductive layer within the pattern 140 from a portion 160 without the pattern 140. The thermal relief pattern is typically created by etching a plurality of cutouts 170a, 170b, 170c, 170d in the conductive layer 120. Interstitially located between the cutouts 170a-d are bands 180a, 180b, 180c, 180d of the conductive layer 120 that remain to carry electricity between the portions 150, 160. As described, the pattern 140 partially blocks the transfer of heat between the portions 150,160 and therefore accomplishes the goal of reducing the tendency of the conductive layer 120 to act as a heat sink.

Unfortunately, the cutouts 170a-d have sharp corners or discontinuities 171a, 171b, 171c, 171d, 172a, 172b, 172c, 172d in the boundary between the cutouts 170a-d and the surrounding conductive layer 120. These discontinuities 171a-d, 172a-d give rise to edge effects when relatively high frequency (perhaps radio frequency) alternating currents encounter them. For instance, if the conductive layer 120 is functioning as a ground plane and a component generates high frequency current desired to grounded, the high frequency current is transmitted through the ground lead of the component, through the solder joint and into the portion 150. However, when the high frequency current meets the discontinuities 171a-d, 172a-d, it reflects or deflects off of them (in a manner well known to those of ordinary skill in the art) rather than travelling around them. This reflection tends to contain the high frequency current to within the portion 150, failing to ground the current by allowing its transmission to the portion 160 and therefore limiting the current-handling capacity of the bands 180a-d of the conductive layer 120.

Figure 2:
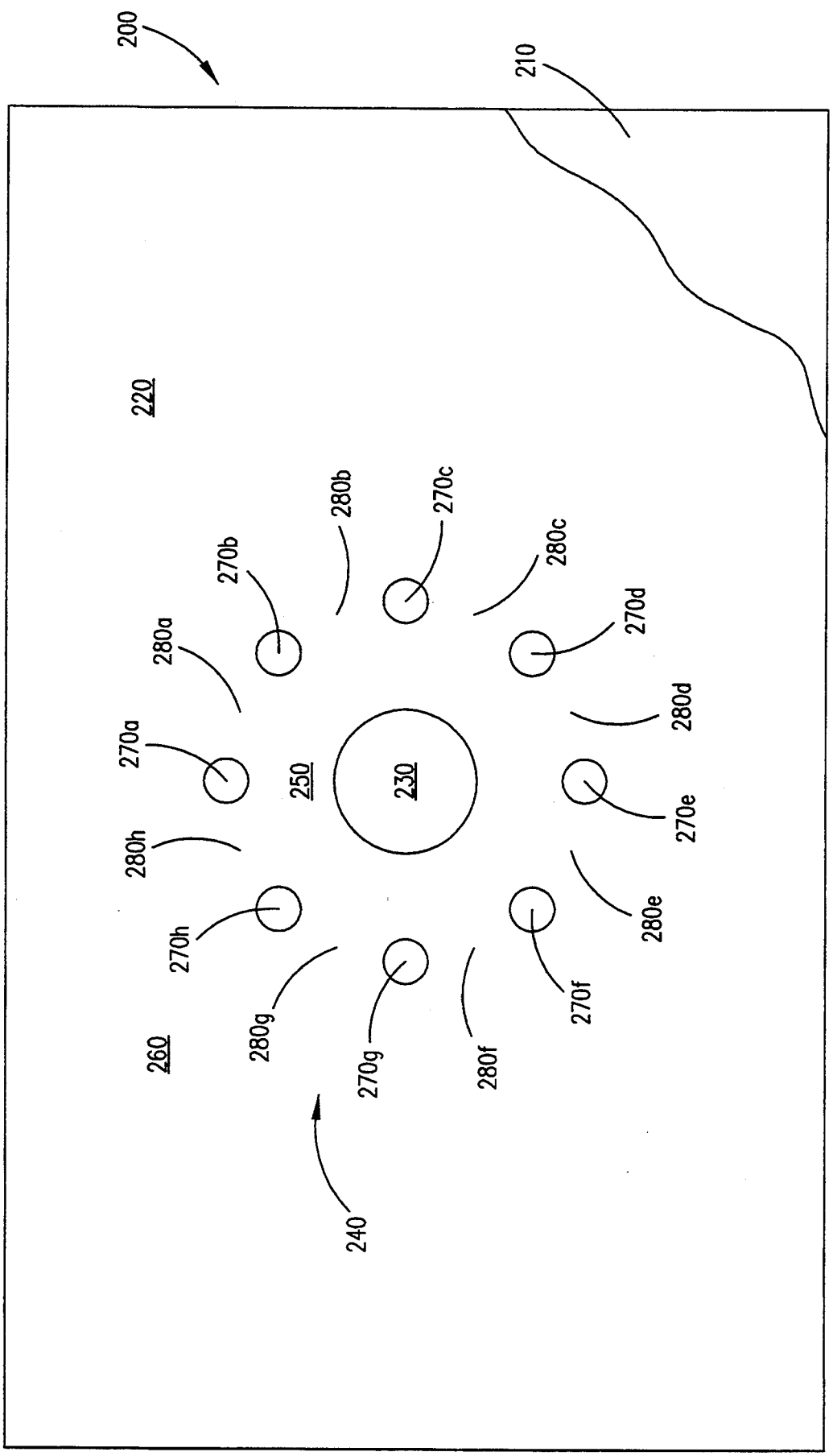
FIG. 2 illustrates a plan view of a circuit board employing the thermal relief pattern of the present invention.

Turning now to FIG. 2, illustrated is a plan view of a circuit board 200 employing the thermal relief pattern of the present invention. Shown are a substrate 210 over which is located a conductive layer 220. A via 230 is shown passing through the substrate 210 and the conductive layer 220. Thus, to this point, FIG. 2 presents a circuit board that is similar in structure and function to that presented in FIG. 1.

The present invention introduces a thermal relief pattern 240 comprising a plurality of apertures 270a, 270b, 270c, 270d, 270e, 270f, 270g, 270h formed in the conductive layer 220. As opposed to the cutouts 170a-d of FIG. 1, the apertures 270a-h are rounded off at their boundaries, eliminating the discontinuities 171a-d, 172a-d found in the prior art cutouts 170a-d (all of FIG. 1).

FIG. 2 further shows a plurality of corresponding bands 280a, 280b, 280c, 280d, 280e, 280f, 280g, 280h in the conductive layer 200 that allow current to flow between a portion 250 of the conductive layer 220 within the pattern 240 and a portion 260 of the conductive layer 220 without the pattern 240. The bands 280a-h cooperate to provide a predetermined minimum level of electrical conduction across the thermal relief pattern 240. Thus, depending upon how much current must be transmitted across the pattern, the size and number of the apertures 270a-h (and thereby the impedance of the bands 280a-h) can be adjusted. Because the apertures 270a-h do not impede the flow of relatively high frequency electric current across the pattern 240 by introducing unwanted edge effects, the current-handling capacity of the bands 280a-h is thereby enhanced. Further, because the relatively high frequency currents are allowed to pass between the portions 250, 260 and therefore dissipate, EMI is reduced.

In the illustrated embodiment, the apertures 280a-h are substantially ovoid and, more particularly, substantially circular. This geometry best ensures that performance-crippling discontinuities are avoided. Further, in the illustrated embodiment, there are eight apertures 270a-h. The present invention is not limited to a particular number of apertures 270a-h. However, it is preferable to provide a number of apertures 270a-h sufficient to provide a desired level of thermal isolation to the portion 250 within the pattern 240.

In one embodiment of the present invention, the via 230 is 18 mils in diameter and the apertures 270a-h are each 10 mils in diameter. The portion 250 and the pattern 240 (together conventionally referred to as a "pad") therefore total 38 mils in diameter. Of course, the present invention is not limited to particular dimensions for the via 230, apertures 270a-h or pad.

Turning now to FIG. 3, illustrated is an isometric view of a multi-layer circuit board 300 employing the thermal relief pattern of the present invention. FIG. 3 is presented primarily for the purpose of showing that power and ground planes are often found in intermediate layers of a multi-layer circuit board.

The circuit board 300 comprises a plurality of alternating substrate layers 310 and conductive layers 320, among which are a ground plane 330 and a power plane 340. In addition to the ground plane 330 and power plane 340, FIG. 3 shows a first via 350 and a second via 360 passing through the circuit board 300 and contacting the ground plane 330 and the power plane 340, respectively. A component 360 has electrical leads 370 extending through and soldered to the vias 340, 350.

From the above description, it is apparent that the present invention provides a circuit board comprising (1) a substantially planar insulating substrate, the substrate having a via therethrough and (2) a substantially planar conductive layer located over the substrate, the via passing through the layer, the layer having a thermal relief pattern comprising a plurality of apertures located about the via, the plurality of apertures cooperating to restrict heat flow across the thermal relief pattern, each of the plurality of apertures having a boundary with the conductive layer free of discontinuities to inhibit edge effect electromagnetic resonance, the plurality of apertures defining a plurality of corresponding conductive bands in the conductive layer and between the plurality of apertures, the conductive bands cooperating to provide a predetermined minimum level of electrical conduction across the thermal relief pattern.

Although the present invention and its advantages have been described in detail, it should be understood that various changes, substitutions and alterations can be made herein without departing from the spirit and scope of the invention as defined by the appended claims.

What is claimed is:

1. A circuit board, comprising:
    a substantially planar insulating substrate, said substrate having a via therethrough; and
    a substantially planar conductive layer located over said substrate, said via passing through said layer, said layer having a thermal relief pattern comprising a plurality of apertures located about said via, said plurality of apertures cooperating to restrict heat flow across said thermal relief pattern, each of said plurality of apertures having a boundary with said conductive layer free of discontinuities to inhibit edge effect electromagnetic resonance, said plurality of apertures defining a plurality of corresponding conductive bands in said conductive layer and between said plurality of apertures, said conductive bands cooperating to provide a predetermined minimum level of electrical conduction across said thermal relief pattern.

2. The circuit board as recited in claim 1 wherein each of said plurality of apertures are substantially ovoid.

3. The circuit board as recited in claim 1 wherein each of said plurality of apertures are substantially circular.

4. The circuit board as recited in claim 1 wherein said via is adapted to receive a lead of an electronic component.

5. The circuit board as recited in claim 1 wherein said via is adapted to receive molten solder.

6. The circuit board as recited in claim 1 further comprising a conductive coating over an inner surface of said via.

7. The circuit board as recited in claim 1 wherein said conductive layer is adapted to carry radio frequency electric current.

8. The circuit board as recited in claim 1 wherein said conductive layer provides an electrical ground for said circuit board.

9. The circuit board as recited in claim 1 wherein said plurality of apertures are located in a ring surrounding and substantially centered on said via.

10. The circuit board as recited in claim 1 wherein said conductive layer is composed of copper metal.

11. A circuit board, comprising:
a substantially planar insulating substrate, said substrate having a via therethrough, said via adapted to receive a lead of an electronic component and molten solder to create a solder joint; and
a substantially planar conductive layer located over said substrate and adapted to carry radio frequency electric current, said via passing through said layer, said layer having a thermal relief pattern comprising a plurality of apertures located in a ring surrounding and substantially centered on said via, said plurality of apertures cooperating to restrict heat flow across said thermal relief pattern, each of said plurality of apertures having a boundary with said conductive layer free of discontinuities to inhibit edge effect electromagnetic resonance, said plurality of apertures defining a plurality of corresponding conductive bands in said conductive layer and between said plurality of apertures, said conductive bands cooperating to provide a predetermined minimum level of electrical conduction across said thermal relief pattern.

12. The circuit board as recited in claim 11 wherein each of said plurality of apertures are substantially ovoid.

13. The circuit board as recited in claim 11 wherein each of said plurality of apertures are substantially circular.

14. The circuit board as recited in claim 11 further comprising a conductive coating over an inner surface of said via.

15. The circuit board as recited in claim 11 wherein said conductive layer provides an electrical ground for said circuit board.

16. The circuit board as recited in claim 11 wherein said thermal relief pattern comprises five apertures.

17. The circuit board as recited in claim 11 wherein said conductive layer is composed of copper metal.

18. The circuit board as recited in claim 11 wherein said conductive layer is an intermediate layer in said circuit board.

19. The circuit board as recited in claim 11 wherein said plurality of apertures are etched in said conductive layer.

20. The circuit board as recited in claim 11 further comprising a plurality of alternating substrate and conductive layers forming a plurality of spaced-apart conductive patterns for communication of electrical signals.

* * * * *